United States Patent
Stefan et al.

(10) Patent No.: US 8,388,883 B2
(45) Date of Patent: Mar. 5, 2013

(54) PROCESS FOR PRODUCING THERMOELECTRIC SEMICONDUCTOR MATERIALS AND LEGS

(75) Inventors: Madalina Andreea Stefan, Ludwigshafen (DE); Michael Ditscher, Bad Dürkheim (DE)

(73) Assignee: BASF SE, Ludwigshafen (DE)

( * ) Notice: Subject to any disclaimer, the term of this patent is extended or adjusted under 35 U.S.C. 154(b) by 213 days.

(21) Appl. No.: 12/842,673

(22) Filed: Jul. 23, 2010

(65) Prior Publication Data

US 2011/0018155 A1    Jan. 27, 2011

(30) Foreign Application Priority Data

Jul. 27, 2009 (EP) ................................ 09166438

(51) Int. Cl.
  *H01L 35/34* (2006.01)
(52) U.S. Cl. ............... 264/332; 264/5; 264/13; 136/200
(58) Field of Classification Search ............... 264/5, 13, 264/239, 241, 259, 299, 332, 104; 136/200, 136/203, 204
See application file for complete search history.

(56) References Cited

U.S. PATENT DOCUMENTS

| | | | | |
|---|---|---|---|---|
| 3,228,805 A * | 1/1966 | Waseleski, Jr. et al. | ...... | 148/557 |
| 3,391,030 A * | 7/1968 | Beaver, Jr. et al. | ............ | 136/203 |
| 5,093,545 A * | 3/1992 | McGaffigan | .................. | 219/616 |
| 6,025,554 A * | 2/2000 | Macris | .......................... | 136/205 |
| 6,297,441 B1 * | 10/2001 | Macris | .......................... | 136/201 |
| 2003/0217766 A1 * | 11/2003 | Schroeder et al. | ............ | 136/230 |
| 2004/0187905 A1 | 9/2004 | Heremans et al. | | |
| 2010/0024437 A1 * | 2/2010 | Elsner et al. | ..................... | 62/3.2 |

FOREIGN PATENT DOCUMENTS

| DE | 37 04 372 A1 | 8/1988 |
|---|---|---|
| WO | WO 2007/104601 A2 | 9/2007 |

OTHER PUBLICATIONS

U.S. Appl. No. 13/283,009, filed Oct. 27, 2011, Stefan, et al.
George S. Nolas, et al., "Recent Developments in Bulk Thermoelectric Materials," MRS Bulletin, vol. 31, No. 3, Mar. 2006, 8 pages.
U.S. Appl. No. 12/840,693, filed Jul. 21, 2010, Haass, et al.
U.S. Appl. No. 12/810,931, filed Jun. 28, 2010, Kuehling, et al.
U.S. Appl. No. 12/843,233, filed Jul. 26, 2010, Stefan, et al.
U.S. Appl. No. 12/842,453, filed Jul. 23, 2010, Stefan, et al.
Norbert B. Elsner, "Modern Perspectives on Thermoelectrics and Related Materials", Editors: David D. Allred, et al., Materials Reseach Society Symposium Proceedings, vol. 234, May 1-2, 1991, pp. 167-177.
U.S. Appl. No. 12/840,684, filed Jul. 21, 2010, Haass, et al.
U.S. Appl. No. 13/203,407, filed Aug. 25, 2011, Haass.
U.S. Appl. No. 13/259,882, filed Sep. 23, 2011, Seeler, et al.
U.S. Appl. No. 13/259,872, filed Sep. 23, 2011, Stefan, et al.
U.S. Appl. No. 13/262,644, filed Oct. 3, 2011, Stefan, et al.

* cited by examiner

*Primary Examiner* — Galen Hauth
(74) *Attorney, Agent, or Firm* — Oblon, Spivak, McClelland, Maier & Neustadt, L.L.P.

(57) ABSTRACT

The use of induction furnaces for producing thermoelectric legs and components for thermoelectric modules is described, as is a process for producing thermoelectric semiconductor materials by co-melting mixtures of the particular element constituents of the thermoelectric semiconductor materials or alloys thereof in an induction furnace and pouring the melt thus obtained into the mold of a thermoelectric leg, or spraying the melt thus obtained to produce a pulverulent thermoelectric semiconductor material.

8 Claims, 4 Drawing Sheets

PROCESS FOR PRODUCING THERMOELECTRIC SEMICONDUCTOR MATERIALS AND LEGS

The invention relates to a process for producing thermoelectric semiconductor materials and legs.

Thermoelectric generators and Peltier arrangements as such have been known for some time. p- and n-doped semiconductors which are heated on one side and cooled on the other side transport electrical charges through an external circuit, and electrical work can be performed by a load in the circuit. The efficiency of conversion of heat to electrical energy achieved in this process is limited thermodynamically by the Carnot efficiency. Thus, at a temperature of 1000 K on the hot side and 400 K on the "cold" side, an efficiency of (1000−400):1000=60% would be possible. However, only efficiencies of up to 6% have been achieved to date.

On the other hand, when a direct current is applied to such an arrangement, heat is transported from one side to the other side. Such a Peltier arrangement works as a heat pump and is therefore suitable for cooling apparatus parts, vehicles or buildings. Heating via the Peltier principle is also more favorable than conventional heating, because more heat is always transported than corresponds to the energy equivalent supplied.

At present, thermoelectric generators are used in space probes for generating direct currents, for cathodic corrosion protection of pipelines, for energy supply to light buoys and radio buoys and for operating radios and television sets. The advantage of thermoelectric generators lies in their extreme reliability. For instance, they work irrespective of atmospheric conditions such as air humidity; there is no fault-prone mass transfer, but rather only charge transfer; the fuel is combusted continuously, and catalytically without a free flame, as a result of which only small amounts of CO, $NO_x$ and uncombusted fuel are released; it is possible to use any fuels from hydrogen through natural gas, gasoline, kerosene, diesel fuel up to biologically obtained fuels such as rapeseed oil methyl ester.

Thermoelectric energy conversion thus fits extremely flexibly into future requirements such as hydrogen economy or energy generation from renewable energies.

A thermoelectric module consists of p- and n-legs, which are connected electrically in series and thermally in parallel. FIG. 2 shows such a module.

The conventional construction consists of two ceramic plates between which the individual legs are arranged in alternation. Every two legs are conductively connected to electrical contacts via the end faces.

In addition to the electrically conductive contacting, different further layers are normally also applied to the actual material, which serve as protective layers or as solder layers. Ultimately, electrical contact is established between two legs, however, via a metal bridge.

An essential element of thermoelectric components is the contact connection. The contact connection establishes the physical connection between the material in the "heart" of the component (which is responsible for the desired thermoelectric effect of the component) and the "outside world". In detail. The structure of such a contact connection is shown schematically in FIG. 1.

The thermoelectric material 1 within the component is responsible for the actual effect of the component. This is a thermoelectric leg. An electrical current and a thermal current flow through the material 1, in order that it fulfills its purpose in the overall structure.

The material 1 is connected to the supply lines 6 and 7 via the contacts 4 and 5, on at least two sides. The layers 2 and 3 are intended to symbolize one or more intermediate layers which may be necessary (barrier material, solder, adhesion promoter or the like) between the material 1 and the contacts 4 and 5. The segments 2/3, 4/5, 6/7, each of which correspond to one another in pairs, however, need not be identical. This depends ultimately on the specific structure and the application, just as the flow direction of electrical current or thermal current results from the structure.

In order to impart stability to the whole structure and ensure the necessary, very substantially homogeneous thermal coupling over the total number of legs, carrier plates are needed. For this purpose, a ceramic is typically used, for example composed of oxides or nitrides such as $Al_2O_3$, $SiO_2$ or AlN.

This typical structure entails a series of disadvantages. The ceramic and the contacts only have limited mechanical stressability. Mechanical and/or thermal stresses can readily lead to cracks or breakdown of the contact connection, which make the entire module unusable.

In addition, limits are also set on the conventional structure with regard to application, since only planar surfaces can ever be connected to the thermoelectric module. A close connection between the module surface and the heat source/heat sink is indispensible in order to ensure sufficient heat flow.

Non-planar surfaces, for example a round waste heat tube, are not amenable to direct contact with the conventional module, or require a corresponding straightened heat exchanger structure in order to create a transition from the non-planar surface to the planar module.

Suitable semiconductor materials are described, for example, in S. Nolan et al., Recent Developments in Bulk Thermoelectric Materials, MRS Bulletin, Vol. 31, 2006, 199-206. Preferred materials are based, for example, on PbTe.

According to the prior art, the thermoelectric semiconductor materials are produced, for example, by co-melting mixtures of the particular element constituents or alloys thereof in a heatable quartz tube using a rotatable and/or tiltable furnace. The material thus obtained is processed to shaped bodies, for example by grinding, pressing and/or sintering. A corresponding process is described in WO 2007/104601.

The processing of thermoelectric semiconductor materials by hot isostatic pressing is described, for example, in DE-A-3704372. It is stated that a particularly homogeneous material can be obtained virtually without separated material at particle interfaces with complete freedom from pores.

US 2004/0187905 describes the production of a bulk material of the thermoelectric semiconductor material, which is then ground to a powder. After the powder has been classified, a selected powder fraction is pressed at room temperature and then sintered in a furnace.

Some of the processes are complex and frequently allow only the formation of simple geometries.

It is an object of the present invention to provide a process for producing thermoelectric semiconductor materials by co-melting mixtures of the particular element constituents of the thermoelectric semiconductor materials or alloys thereof, which allows particularly homogeneous distribution of dopants in the thermoelectric semiconductor material and enables the direct production of thermoelectric legs in an uncomplicated manner.

The object is achieved in accordance with the invention by use of induction furnaces for producing thermoelectric semiconductor materials, and by a process for producing thermoelectric legs and components for thermoelectric modules and by co-melting mixtures of the particular element constituents of the thermoelectric semiconductor materials or alloys thereof in an induction furnace and pouring the melt thus obtained into the mold of a thermoelectric leg, or spraying the melt thus obtained to produce a pulverulent thermoelectric semiconductor material. The sprayed melt leads to a mean particle size of preferably 1 µm to 5 mm, more preferably 1 µm to 1 mm, especially 1 to 500 µm. The sprayed melt can be cooled on a cooled solid surface, in a liquid medium or by gas countercurrent.

Figure 1:
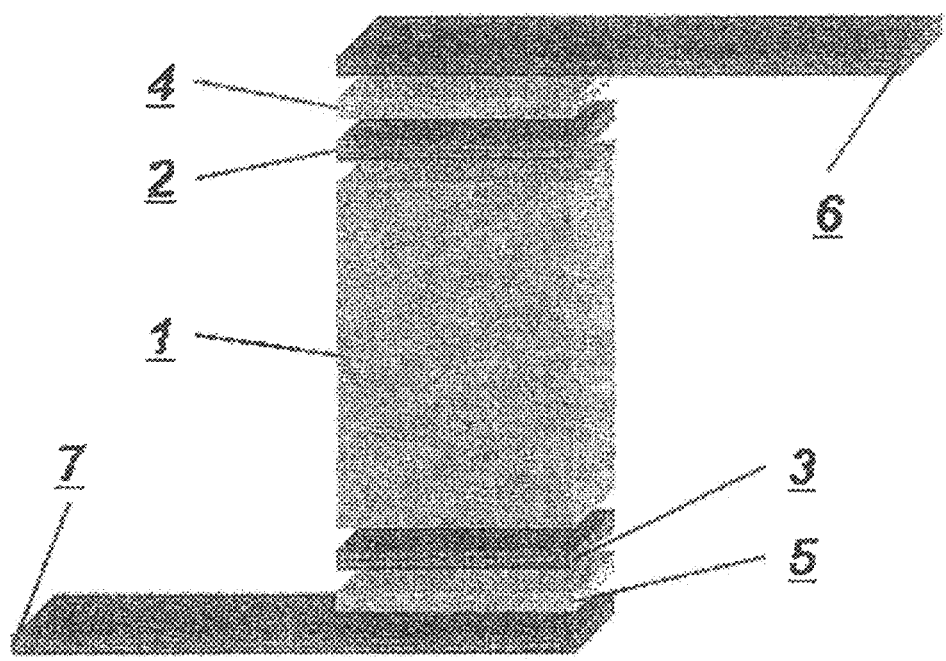
FIG. 1 provides a schematic depiction of an example of a strucure of a contact connection in a thermoelectric component.
Figure 2:
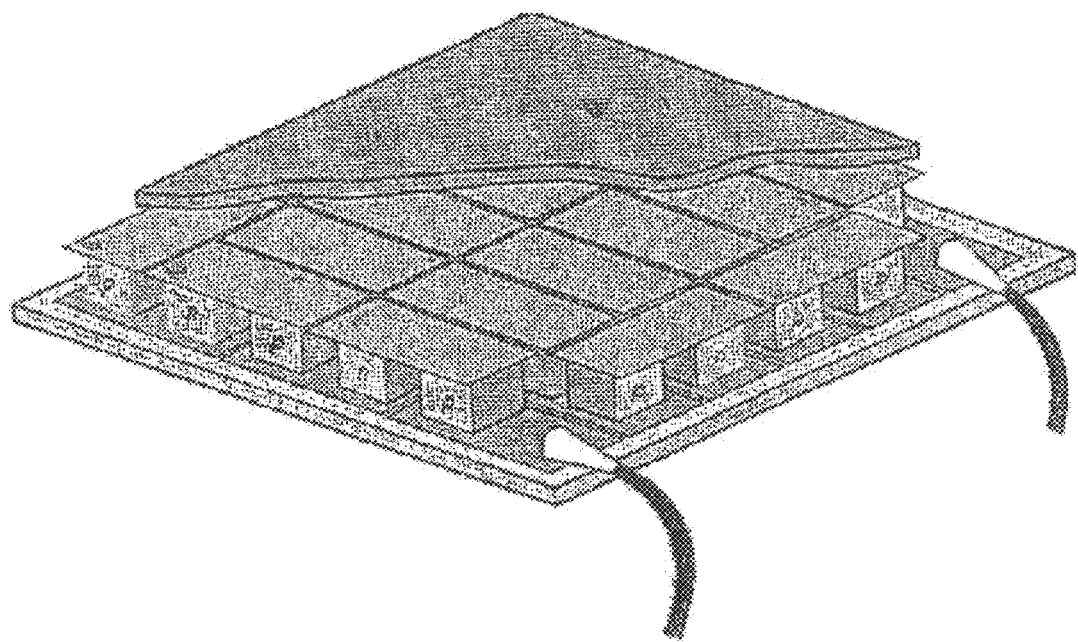
FIG. 2 provides a depiction of an example of a thermoelectric module having p- and n-legs, which are connected electrically in series and thermally in parallel.

It has been found in accordance with the invention that induction furnaces advantageously enable co-melting of thermoelectric semiconductor materials, in which case shaping can be performed immediately thereafter.

By virtue of the present invention, from material to module production, parts of the working steps can be saved or simplified.

It has additionally been found in accordance with the invention that particularly advantageous homogeneously mixed thermoelectric semiconductor materials are obtainable when element constituents of the thermoelectric semiconductor materials or low-reactivity alloys thereof are first co-melted, and then element constituents of the thermoelectric materials or higher-reactivity alloys thereof are added to this melt. In principle, the components are converted according to their reaction rate, beginning with components with a low reaction rate, which are reacted first with the main constituents of the thermoelectric semiconductor material. Subsequently, components with shorter reaction time are added.

For example, the thermoelectric semiconductor material may be a doped lead telluride, in which case lead telluride is, or lead and tellurium are, first co-melted with low-reactivity dopants, and then higher-reactivity dopants are added to this melt.

This multistage batch process allows the production of materials with improved thermoelectric properties and excellent homogeneity. An additional material homogenization, for example by subsequent heat treatment and/or mechanical mixing, can thus generally be dispensed with.

Element constituents or alloys with low reactivity are, for example, Al, Si, B, Ti, Zr, Hf, Nb, Ta, Cr, Mo, W, Cu, Co, Ni and/or noble metals.

Element constituents with higher reactivity are, for example, alkali metals, alkaline earth metals, Sn, Ga, In, Tl, As, P, Sb, Bi, S, Se, Te, halides, chalcogenides, V, Mn, Fe, Zn, Cd.

The structure of the induction furnaces used in the process according to the invention is not subject to any particular restrictions. An induction furnace transfers the energy by means of a resonant circuit or a coil. The heating is achieved by induction of an eddy current in the thermoelectric semiconductor material. The core of the induction furnace is the induction coil, in which a magnetic alternating field builds up when an alternating current flows through it.

In the process according to the invention, the molten thermoelectric semiconductor materials are converted directly from the melt to the shape of a thermoelectric leg, for example by casting, extrusion or solidification. It is possible to select any desired shapes for the thermoelectric leg. The thermoelectric legs can then be removed from the mold.

It is particularly advantageous when the melt of the thermoelectric semi-conductor material is poured under ambient pressure, under reduced pressure or under pressure into a matrix mold which is composed of a matrix material with low thermal conductivity and negligible electrical conductivity and has a plurality of recesses for accommodating the thermoelectric semiconductor material, the matrix with the thermoelectric semiconductor material enclosed therein becoming part of a later thermoelectric module.

The matrix material may be formed from any desired suitable materials, provided that they combine a low thermal conductivity with electrical insulation properties, and are dimensionally stable at the temperature of the molten thermoelectric semiconductor material. The matrix material preferably comprises a ceramic material or a mixture of ceramic material and glass, mica, aerogel or a combination of these materials. It is also possible to use organic polymer materials, provided that the melting temperature is higher than the use temperature. The matrix imparts stability to a later thermoelectric module, allows simple module production and protects the thermoelectric system composed of materials and contacts from degradation and contamination owing to external influences such as moisture, oxygen and chemicals, and cross-contamination of the n- and p-legs as a result of sublimation of the thermoelectric material. The matrix comprises the above materials or consists thereof. These are materials or material mixtures with low thermal conductivity, such that the heat in later use flows through the thermoelectric material and not through the matrix.

The matrix material can be converted to a suitable shape by any desired processes. The matrix can be converted to the suitable shape, for example, by injection molding or extrusion. This shape has recesses for accommodating the thermoelectric semiconductor material, such that it allows the formation of thermoelectric modules.

There are preferably numerous recesses in the matrix material. The matrix may have any desired suitable three-dimensional shape. It may have a flat or curved configuration, for example. In the case of a flat configuration, the recesses for accommodating the thermoelectric semiconductor material are preferably configured at right angles to the surface.

These recesses preferably occupy the majority of the spatial extent of the matrix material, in order that there is a high fill level of the thermoelectric semiconductor material in the later thermoelectric module. For example, the recesses may be present in the form of a honeycomb structure, as also known from automotive exhaust gas catalysts. It is also possible for rows of recesses to be present in the matrix material, in which case the adjacent rows may be shifted laterally with respect to one another.

The configuration of the matrix material is typically such that the remaining recesses for the thermoelectric legs correspond to the structure of a typical thermoelectric module.

A lower fill level may be advisable in the case of large areas or when the heat flow per unit area is insufficient.

Since, to form a thermoelectric module, p- and n-conductive thermoelectric semiconductor materials must be connected to one another in alternation, preference is given to pouring p- and n-conductive thermoelectric semiconductor materials into alternating recesses. Alternatively, it is possible to fill each recess half with p-conductive and half with n-conductive thermoelectric semiconductor materials to directly form thermoelectric leg pairs, in which case the legs are electrically insulated from one another.

In the process according to the invention, the starting materials in the desired stoichiometry are introduced into a vessel, preferably made of ceramic, quartz or graphite, and converted in an induction furnace. In the simplest case, a one-pot conversion is performed.

To improve the homogeneity and the thermoelectric properties, two-stage or multistage induction melting as described above can be effected, starting first with starting materials or dopants with low reaction rate, and later adding starting materials or dopants of higher reactivity. To fill the recesses, the matrix is preferably conducted past the exit orifice of the induction furnace. For example, a matrix strand can be conducted past the exit orifice of the induction furnace using a conveyor belt, the forward motion being regulated stepwise such that the recesses can be filled each time with thermoelectric semiconductor material.

The shape of the matrix can be selected as desired, except that the matrix must correspondingly be moved past the exit orifice of the induction furnace such that all recesses can be filled in succession. The filling should preferably proceed under an inert gas atmosphere in order to prevent oxidation of the thermoelectric semiconductor materials. The matrix shape may, for example, be a plate or a cylinder or another geometric shape. The recesses too may have any desired geometric shape. The recesses preferably have a cylindrical or cubic shape. A particularly suitable shape is the honeycomb form of the matrix owing to the high cavity density which can be filled with thermoelectric semiconductor material, and the thin electrically insulating walls.

The process according to the invention has the advantage that preferably only the thermoelectric semiconductor material is heated in the induction furnace. The matrix material is heated only to a minor degree, if at all, by induction, such that chemical contamination of the thermoelectric semiconductor material can be prevented.

Figure 3:
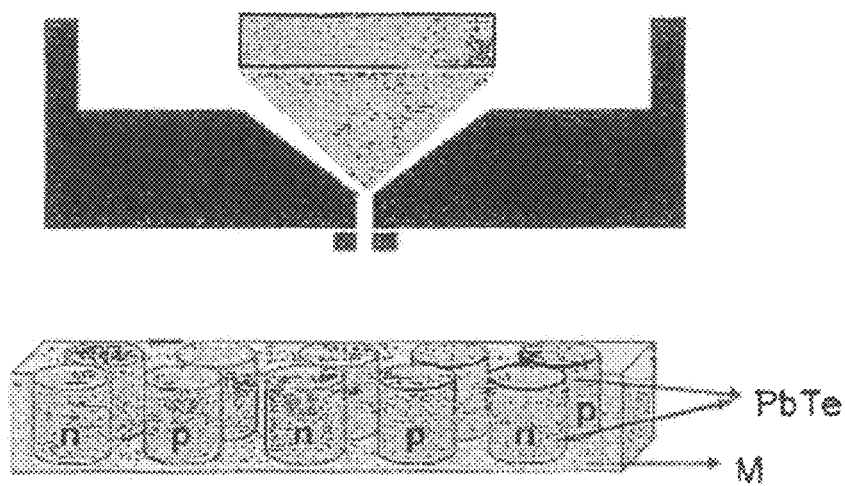
FIG. 3 shows a basic structure of an exemplary process according to the present invention.

FIG. 3 shows the basic structure of the process according to the invention. The upper part shows the induction furnace with the thermoelectric semiconductor material present therein. The material is poured through an outlet, for example in slot die form, into a matrix M. One example is a PbTe thermoelectric material.

Figure 4:
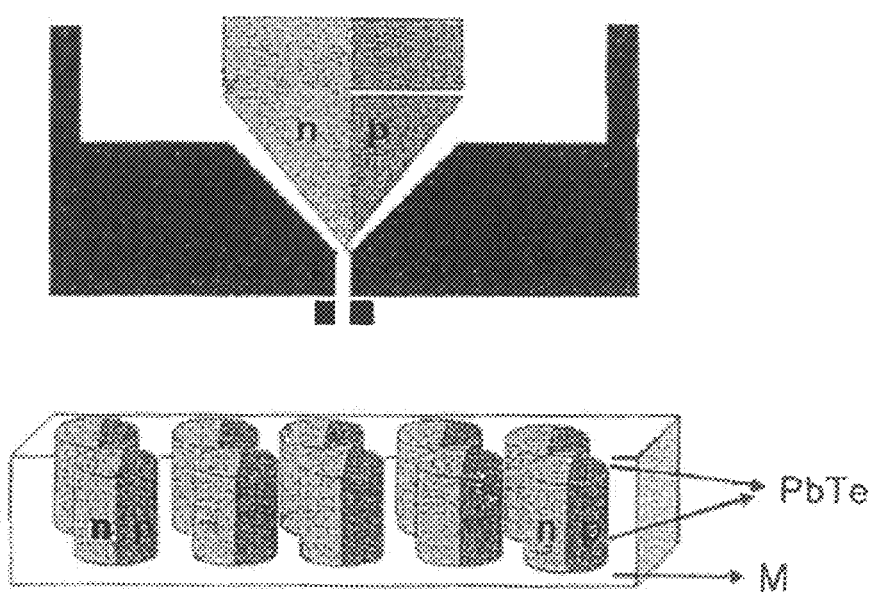
FIG. 4 provides a diagram of in situ leg pair production in a matrix.

The in situ leg pair production in a matrix is shown in FIG. 4. The recesses of the matrix M are each filled there half with p-conductive and half with n-conductive thermoelectric material (in the example, PbTe).

FIGS. 3 and 4 show the matrix in flat form. A corresponding matrix band can, however, also be rolled up or shaped to give a ring or cylinder, in which case a corresponding ring is conducted past the exit orifice of the induction furnace with rotation.

The matrix not only ensures good mechanical stability of the module but also enables protection against oxidation, sublimation or cross-contamination of the thermoelectric semiconductor materials. By virtue of appropriate shaping of the matrix material, three-dimensional structures of the later thermoelectric modules which can be matched to the particular application are obtainable. After the introduction of the thermoelectric semiconductor materials, a contact connection, as described at the outset, has to be carried out. This can involve applying electrical contacts, preferably to the thermoelectric legs, by induction soldering or induction welding. The contacts may have flexibility sites in order to exhibit resistance to thermal stresses. Spring connections or connections with compensating elements for thermal expansion allow implementation or integration into cooling or heating systems. The thermoelectric module can be integrated, for example, into pipes or exhaust gas systems, provided that the tubes are electrically insulated. The contacts can also be connected as described in Mat. Res. Soc. Symp. Proc. Vol. 234, 1991, pages 167 to 177. An advantageous feature in the case of induction soldering or induction welding is the very rapid heating and cooling of the thermoelectric legs and of the connection sites. More particularly, welding is advisable for the high-temperature sides of the thermoelectric legs, whereas customary soldering can also be performed on the cold side. Owing to the matrix structure, the simultaneous connection of numerous thermoelectric legs in one step is possible.

Before the induction welding, it is possible, if necessary, to apply one or more intermediate layers which may be necessary, such as barrier material or adhesion promoter. This may be preceded, if required, by polishing, lapping or plane-parallel alignment.

It is preferred in accordance with the invention to pour the melt obtained by induction melting directly into the mold of a thermoelectric leg. If, in exceptional cases, the homogeneity of the material is unsatisfactory after the synthesis, the solidification of the melt can be followed by grinding of the material, after which the powder obtained is again introduced into the induction furnace, melted again (rapidly) and then poured into the leg mold.

Instead of homogenization and comminution of the thermoelectric material by grinding the green body after the synthesis, the production of a powder of the thermoelectric material directly from the melt has been found to be advantageous. This involves spraying the melt through an orifice in the crucible base. Spraying into an inert gas countercurrent has been found to be particularly advantageous. This involves spraying the melt with pressure through an orifice in the reaction crucible into a tower. A countercurrent of inert gas or inert gas/$H_2$ is introduced into this tower. The orifice of the reaction crucible should be heated in order to prevent blockage of the crucible. This produces the thermoelectric material in a powder size between 100 nm and 5 mm. The process according to the invention has the advantage that a broader particle size distribution of the thermoelectric powder is producible, which has been found to be particularly advantageous for good induction sintering. In addition, the cooling medium used may also be a liquid medium (oils, silicone oil, organic solvents and water) or a solid medium (metal, glass or ceramic band or base).

It is also possible in this case to directly introduce the pulverulent thermoelectric semiconductor material into the recesses of the matrix mold, and to sinter it with compression in an induction furnace. In accordance with the invention, it is also possible in this way to produce thermoelectric legs in a matrix mold from a matrix material with low thermal conductivity and zero electrical conductivity. The powder of the thermoelectric material produced by means of induction can be processed to legs by known processes, see, for example, WO 2007/104601, and connected to electrical contacts, see above.

To produce very dense materials, the sintering can be combined with compression. The sintering temperature in this case can be selected freely. For PbTe materials, the sintering temperature is preferably 300 to 800° C., more preferably 500 to 800° C. The sintering time by induction heating may be from a few seconds up to hours. Preference is given to sintering times in the second or minute range. In the course of sintering, an inert gas atmosphere should be ensured.

The invention is illustrated in detail by the examples which follow.

EXAMPLES

1) Production of Thermoelectric Materials and Legs by Induction Heating

For the experiments, commercially available reactants were used.

Pb: 5 kg bars, purity>99.99%. The Pb bars were freed of the oxide layer adhering to the surface and reduced to turnings. The turnings were used directly for the syntheses.

Te: 5 kg bars, purity>99.999%. The Te bars were coarsely precomminuted and the pieces were used directly for the syntheses.

Dopants (Sn, Ge): purity>99.9%. The metal bars were comminuted manually and the pieces were used as the dopant either directly for the syntheses or in the form of a prealloy.

For the material production, an induction furnace with a capacity of 1500 cm$^3$, maximum power of 25 kW, max. temperature of 1500° C., frequency range 4-5.5 kHz was used.

The regulation temperature was detected at the crucible wall with an Ni/CrNi thermocouple (safeguarded in a ceramic protective tube). Comparative sample measurements were also made directly in the melt by means of a lowerable, ceramic-encased thermocouple. For this purpose, there was a small hole in the crucible lid, which (when the thermocouple was not inserted) was covered with a ceramic paper.

The reactants were introduced into the Sigradur crucible in the appropriate quantitative ratio.

Before the start of the experiment, the furnace was repeatedly evacuated and flushed again with argon.

The following procedure was carried out: heating to 1050° C., approx. 100 K min$^{-1}$, holding at 1050° C. for 160 min. The melt was subsequently poured into a ceramic mold, preheated to 800° C., under slight Ar/H$_2$ pressure (0.2 bar).

2) Production of Thermoelectric Legs by Induction Sintering 2.3 g of powder (particle size 1 μm-1 mm) of the thermoelectric material were introduced into a graphite crucible with a graphite die. The crucible was introduced into a VC500 induction furnace (manufacturer: Indutherm GmbH). The furnace space was filled to 0.2 mbar with Ar/H$_2$ gas. A temperature of 700° C. was set (power: 1.2-14.5 kW), and controlled by means of two thermocouples in the crucible wall and in the die wall. On attainment of the temperature, a pressure of 3 bar was applied to the sample and maintained for 5 min. Subsequently, the pressure was released and the induction heating was switched off. The sample had a density of 95% of the theoretical value.

3) Production of the Electrical Contacts by Induction Sintering/Pressing

Analogously to experiment 2), the electrodes were first placed onto the base of the crucible, and then the powder. For the contacting of a leg pair of n and p material, the crucible was divided by a graphite wall (removable after the sintering) or mica wall (no removal necessary after the sintering). Subsequently, the sintering and contact connection were performed in one step as described in experiment 2.

The invention claimed is:

1. A process for producing thermoelectric semiconductor materials by co-melting mixtures of the particular element constituents of the thermoelectric semiconductor materials or alloys thereof in an induction furnace and pouring the melt thus obtained into the mold of a thermoelectric leg, or spraying the melt thus obtained to produce a pulverulent thermoelectric semiconductor material, wherein low reactivity element constituents of the thermoelectric semiconductor materials are first co-melted, and then high reactivity element constituents of the thermoelectric semiconductor materials are added to this melt,
   wherein low reactivity element constituents are one or more members selected from the group consisting of Al, Si, B, Ti, Zr, Hf, Nb, Ta, Cr, Mo, W, Cu, Co, Ni, noble metals, and alloys thereof, and
   wherein high reactivity element constituents of the thermoelectric semiconductor materials are one or more members selected from the group consisting of alkali metals, alkaline earth metals, Sn, Ga, In, Tl, As, P, Sb, Bi, S, Se, Te, halides, chalcogenides, V, Mn, Fe, Zn, Cd, and alloys thereof.

2. The process according to claim 1, wherein the thermoelectric semiconductor material is a doped lead telluride, and lead telluride is, or lead and tellurium are, first co-melted with low-reactivity dopants, and then higher-reactivity dopants are added to this melt.

3. The process according to claim 1, wherein the melt of the thermoelectric semiconductor material is poured under ambient pressure, under reduced pressure or under pressure into a matrix mold which is composed of a matrix material with low thermal conductivity and negligible electrical conductivity and has a plurality of recesses for accommodating the thermoelectric semiconductor material, the matrix with the thermoelectric semiconductor material enclosed therein becoming part of a later thermoelectric module.

4. The process according to claim 3, wherein the matrix has a flat configuration and the recesses for accommodating the thermoelectric semiconductor material are configured at right angles to the surface.

5. The process according to claim 4, wherein the recesses are present in the form of a honeycomb structure.

6. The process according to claim 3, wherein p- and n-conductive thermoelectric semiconductor materials are poured into alternating recesses, or each recess is filled half with p-conductive and half with n-conductive thermoelectric semiconductor materials to directly form thermoelectric leg pairs.

7. The process according to claim 3, wherein electrical contacts are subsequently applied to the thermoelectric legs by induction soldering or induction welding.

8. The process for producing thermoelectric legs in a matrix mold which is composed of a matrix material with low thermal conductivity and zero electrical conductivity, and has a plurality of recesses for accommodating the a thermoelectric semiconductor material, in which pulverulent thermoelectric semiconductor material produced by the method according to claim 1 is introduced into the recesses of the matrix mold and sintered in an induction furnace with compression.

* * * * *